United States Patent
Von Rauch

(10) Patent No.: US 6,286,372 B1
(45) Date of Patent: Sep. 11, 2001

(54) PRESSURE DIFFERENTIAL MEASURING TRANSDUCER

(75) Inventor: Moriz Von Rauch, Berlin (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/380,237

(22) PCT Filed: Feb. 20, 1998

(86) PCT No.: PCT/DE98/00515

§ 371 Date: Jan. 12, 2000

§ 102(e) Date: Jan. 12, 2000

(87) PCT Pub. No.: WO98/38484

PCT Pub. Date: Sep. 3, 1998

(30) Foreign Application Priority Data

Mar. 28, 1997 (DE) .............................. 197 09 846

(51) Int. Cl.[7] .............................. G01L 13/02; G01L 7/08
(52) U.S. Cl. .................................. 73/716; 73/715
(58) Field of Search .................... 73/716, 721, 727, 73/756, 724, 718, 715, 720, 726; 361/283–4

(56) References Cited

U.S. PATENT DOCUMENTS

| 2,979,955 | 4/1961 | Shepler . |
| 4,895,026 | * 1/1990 | Tada ....................................... 73/721 |
| 5,569,856 | 10/1996 | Jacobs-Cook . |

FOREIGN PATENT DOCUMENTS

| 41 32 391 | 10/1992 | (DE) . |
| 0 164 413 | 12/1985 | (EP) . |
| 0 753 728 | 1/1997 | (EP) . |
| WO 85/02677 | 6/1985 | (WO) . |
| WO 88/01049 | 2/1988 | (WO) . |

* cited by examiner

Primary Examiner—Benjamin R. Fuller
Assistant Examiner—Abdullahi Aw-Musse
(74) Attorney, Agent, or Firm—BakerBotts LLP

(57) ABSTRACT

A pressure differential measuring transducer has measuring membranes arranged side by side on one side of a membrane disk and a common fluid space allocated to them. To obtain a measured electric quantity which is proportional to a pressure difference and is independent of changes in static pressure with such a measuring transducer, a part of the membrane disk carrying a first measuring membrane is accommodated from the side in the interior of a tube with a seal, said tube being acted upon by a first pressure at its one end and at its other open end. Another part of the membrane disk having a second measuring membrane extends into an interior space of a container adjacent to the tube to which a second pressure can be applied.

5 Claims, 1 Drawing Sheet

PRESSURE DIFFERENTIAL MEASURING TRANSDUCER

BACKGROUND OF THE INFORMATION

European Patent No. 0 164 413 describes a pressure differential measuring transducer having a membrane disk designed as a membrane wafer made of silicon. Two side by side measuring membranes side by side are formed by thinning (via etching) the membrane wafer in the area of the two measuring membranes. The two measuring membranes are in contact with a common fluid space formed by a recess in another wafer fixedly connected to the membrane wafer. On the side of the measuring membranes facing away from the common fluid space, they are acted upon by a first pressure and a second pressure, so that the deflection of each of the two measuring membranes indicates the pressure difference.

SUMMARY

An object of the present invention is to provide a pressure differential measuring transducer, where the zero point and sensitivity are almost completely independent of changes in static pressure.

To achieve this object, a pressure differential measuring transducer is provided having a first measuring membrane which is on a surface of a membrane disk and can be acted upon by a first pressure on its one side, and having a second measuring membrane next to the first measuring membrane which can be acted upon by a second pressure on its one side and having a common tight fluid space bordering on the other sides of the measuring membranes. The first pressure can be supplied to the open end of a tube which is closed at its other end. A part of the membrane disk carrying the first measuring membrane penetrates through the interior of the tube between its two ends with a seal and its dimensions are such that the first pressure can act on both sides of the membrane disk in the interior of the tube. Another part of the membrane disk having the second measuring membrane extends in an interior space of a container adjacent to the tube to which the second pressure can be supplied, so that it can be acted upon by the second pressure on both sides.

An advantage of the pressure differential measuring transducer according to the present invention is that the part of the membrane disk carrying the first membrane is exposed to the one pressure on both sides, so that there can be no "breathing" of this part of the membrane disk when there are changes in static pressure. The same thing is also true regarding the second part of the membrane disk because this part is also exposed to the second pressure on all sides. Thus, there is no change in volume of the membrane disk on the whole when there is a change in static pressure with the pressure differential measuring transducer according to the present invention, so that the initial tension of the two measuring membranes does not change. Therefore, the zero point and sensitivity are independent of the static pressure, which has a very advantageous effect on the measurement accuracy of the pressure differential measuring transducer according to the present invention.

With the pressure differential measuring transducer according to the present invention, the membrane disk may be made of different materials. With regard to the simplest possible production and the smallest possible design of the measuring transducer, it is especially advantageous if the membrane disk is made of silicon and the tube is made of a material with a thermal expansion coefficient similar to that of silicon.

For sealed mounting of the membrane disk in the tube, it is advantageous if the one part of the membrane disk is mounted on the tube with a seal provided by solder or an adhesive. The adhesive may advantageously contain ceramic beads; then there is the possibility of keeping the distance between the membrane disk and the transverse slit in the tube as uniform as possible throughout.

There are various options with regard to accommodation of the tube provided with the membrane disk in an overall structure of the pressure differential measuring transducer according to the present invention. It is especially advantageous if the tube is mounted with its open end in the area of an opening in the container with a seal and if the container has another opening through which the second pressure can be supplied.

DETAILED DESCRIPTION

Figure 1:
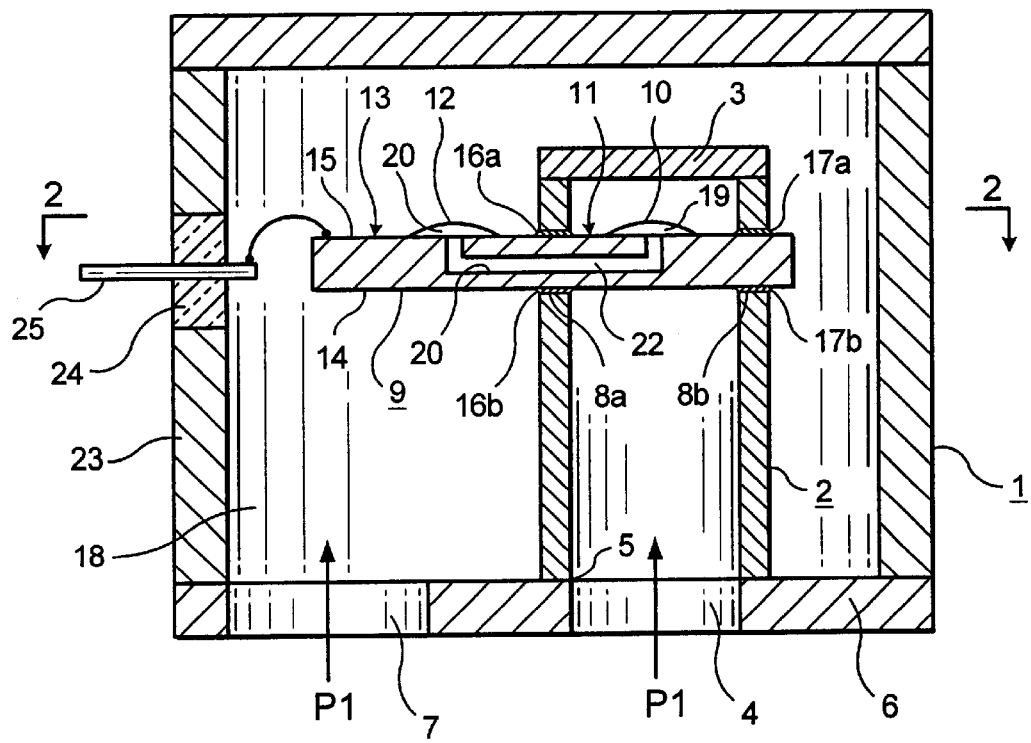
FIG. 1 shows a longitudinal section through an embodiment of the pressure differential measuring transducer according to the present invention.
Figure 2:
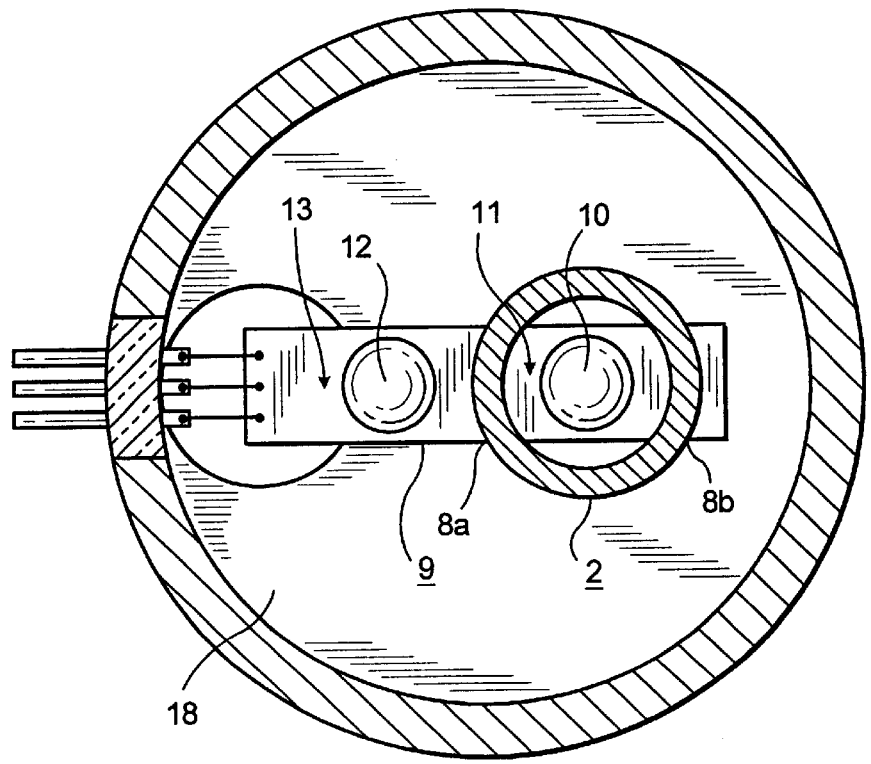
FIG. 2 shows a cross section along line 2—2 of the shown in FIG. 1 embodiment.

As shown in FIGS. 1 and 2, a tube 2 is accommodated in a container 1. Tube 2 is closed on its upper end 3 in FIG. 1 and is open at its other end 4. Edge 5 of open end 4 of tube 2 is connected to a covering part 6 of container 1 with a seal. Tube 2 is exposed to a first pressure P1 through open end 4. Through another opening 7 in container 1, there is a connection to a second pressure P2.

As also shown in the figures, tube 2 is provided with two diametric slits 8a and 8b into which a membrane disk 9 is inserted from the side. Membrane disk 9 has a part 11 carrying a first membrane 10 which is indicated only schematically in the figures and another part 13 carrying a second membrane 12 which is also indicated only schematically. Membrane disk 9 is pushed with its one part 11 through slits 8a and 8b of tube 2 so that first membrane 10 is completely inside tube 2; care is taken to ensure that tube 2 is not completely filled up in its cross section by the one part 11, so that a first pressure P1 acts on the one part 11 of membrane disk 9 not only on its one side 14 but also on its other side 15. The one part 11 of membrane disk 9 is thus subjected to first pressure P1 on both sides, and therefore it does not undergo any changes in dimensions when there are changes in static pressure.

As shown in particular in FIG. 1, the one part 11 of membrane disk 9 is connected to tube 2 with a seal by two adhesive spots 16a, 16b and 17a, 17b. The change adhesive used here is oil-resistant, since there is oil inside tube 2 and inside container 1 up to conventional dividing membranes (not shown). Optionally, the adhesive may also contain ceramic beads if the gap between membrane disk 9 and tube 2 is to be filled uniformly in the area of slits 8a and 8b.

Additional part 13 of membrane disk 9 is completely within interior space 18 of container 1 and is exposed freely to a second pressure P2, as shown in FIG. 1. This means that additional part 13 of membrane disk 9 is exposed to pressure P2 everywhere.

Measuring chambers 19 and 20 (only shown schematically in FIG. 1) beneath measuring membranes 10 and 12 are connected to one another by a connecting line 21, forming a common fluid space 22, which is filled with oil and sealed in the usual manner.

A glass bushing 24 is provided on the side in a wall 23 of container 7 with electric terminal posts 25 passing through it. These are connected to membrane disk 9 by bond wires.

Measurement of the pressure difference by measuring membranes 10 and 12 which are deflected according to pressures P1 and P2 can take place in the known way, which is why these details are not shown in the figures for the sake of simplicity. For example, it is possible to form a measuring capacitor with measuring membranes 10 and 12 and counter-electrodes lying opposite the membranes and to analyze electrically the changes in capacitance resulting according to the pressure difference. However, it is also possible, for example, to provide resistance arrangements in the manner of wire strain gages on both membranes 10 and 12 and to gain a measured quantity corresponding to the pressure difference in this way.

What is claimed is:

1. A pressure differential measuring transducer, comprising:

a membrane disk having two sides, a first side of the membrane disk carrying a first measuring membrane and a second measuring membrane, a first portion of the membrane disk carrying the first measuring membrane, a second portion of the membrane disk carrying the second measuring membrane, the first measuring membrane being adjacent to the second measuring membrane, a first side of the first measuring membrane for responding to a first pressure, a first side of the second measuring membrane for responding to a second pressure, a common fluid tight space bordering a second side of the first measuring membrane and a second side of the second measuring membrane;

a tube having an interior, an open end and a closed end, the first pressure being supplied to the open end of the tube, the first portion of the membrane disk carrying the first measuring membrane sealingly penetrating the interior of the tube between the open end of the tube and the closed end of the tube so that the first pressure acts on the two sides of the membrane disk in the interior of the tube; and a container containing the tube, the second portion of the membrane disk carrying the second measuring membrane extending in an interior space of the container adjacent to the tube, the second pressure being supplied to the interior space of the container so that the second pressure acts on the two sides of the membrane disk extending in the interior space of the container adjacent to the tube.

2. The pressure differential measuring transducer according to claim 1, wherein the membrane disk is made of silicon, and the tube is made of a material with a thermal expansion coefficient similar to that of silicon.

3. The pressure differential measuring transducer according to claim 1, wherein the first portion of the membrane disk is mounted on the tube with a seal provided by one of solder and an adhesive.

4. The pressure differential measuring transducer according to claim 3, wherein the adhesive contains ceramic beads.

5. The pressure differential measuring transducer according to claim 1, wherein the open end of the tube is mounted in an area of a first opening of the container with a seal, and wherein the container includes a second opening through which the second pressure is supplied.

* * * * *